US012787648B2

(12) United States Patent
Ghyselen et al.

(10) Patent No.: US 12,787,648 B2
(45) Date of Patent: Nov. 3, 2026

(54) COMPOSITE STRUCTURE FOR MEMS APPLICATIONS, COMPRISING A DEFORMABLE LAYER AND A PIEZOELECTRIC LAYER, AND ASSOCIATED MANUFACTURING PROCESS

(71) Applicant: Soitec, Bernin (FR)

(72) Inventors: Bruno Ghyselen, Bernin (FR); François Darras, Bernin (FR)

(73) Assignee: Soitec, Bernin (FR)

( * ) Notice: Subject to any disclaimer, the term of this patent is extended or adjusted under 35 U.S.C. 154(b) by 783 days.

(21) Appl. No.: 18/246,414

(22) PCT Filed: Sep. 27, 2021

(86) PCT No.: PCT/FR2021/051662
§ 371 (c)(1),
(2) Date: Mar. 23, 2023

(87) PCT Pub. No.: WO2022/079366
PCT Pub. Date: Apr. 21, 2022

(65) Prior Publication Data

US 2023/0371386 A1 Nov. 16, 2023

(30) Foreign Application Priority Data

Oct. 16, 2020 (FR) ...................................... 2010659

(51) Int. Cl.
*H10N 30/20* (2023.01)
*H10N 30/072* (2023.01)
*H10N 30/30* (2023.01)

(52) U.S. Cl.
CPC ....... *H10N 30/2047* (2023.02); *H10N 30/072* (2023.02); *H10N 30/308* (2023.02)

(58) Field of Classification Search
CPC ............. H10N 30/2047; H10N 30/072; H10N 30/308; H10N 30/704; H10N 30/853
See application file for complete search history.

(56) References Cited

U.S. PATENT DOCUMENTS 7,758,979 B2 * 7/2010 Akiyama ........... H10N 30/2042 428/704
2008/0296529 A1 12/2008 Akiyama et al.
(Continued)

FOREIGN PATENT DOCUMENTS

CN 106660074 A 5/2017
CN 110057907 A 7/2019
(Continued)

OTHER PUBLICATIONS

Taiwanese Office Action and Search Report for Application No. 110137091 dated Feb. 11, 2025, 17 pages with machine translation.
Japanese Notice of Reasons for Rejection for Application No. 2023-518763 dated Jun. 10, 2025, 10 pages with English translation.
(Continued)

*Primary Examiner* — Emily P Pham
(74) *Attorney, Agent, or Firm* — TraskBritt

(57) ABSTRACT

A composite structure comprises a receiver substrate having at least one cavity defined in the substrate and devoid of solid material or filled with a sacrificial solid material, a single-crystal semiconductor layer disposed on the receiver substrate, the layer having a free surface over the entire extent of the structure and a thickness between 0.1 micron and 100 microns, and a piezoelectric layer secured to the single-crystal semiconductor layer and located between the single-crystal semiconductor layer and the receiver substrate.
A device is based on a movable membrane above a cavity, and is formed from the composite structure.
A method is used to fabricate the composite structure.

17 Claims, 5 Drawing Sheets

(56) References Cited

U.S. PATENT DOCUMENTS

| | | | |
|---|---|---|---|
| 2009/0325335 A1 | 12/2009 | Perruchot et al. | |
| 2010/0301703 A1 | 12/2010 | Chen et al. | |
| 2015/0165479 A1* | 6/2015 | Lasiter | B06B 1/0666 29/25.35 |
| 2019/0006577 A1 | 1/2019 | Ghyselen et al. | |

FOREIGN PATENT DOCUMENTS

| | | | |
|---|---|---|---|
| CN | 111262551 | A | 6/2020 |
| JP | 2005-229776 | A | 8/2005 |
| JP | 2009-010926 | A | 1/2009 |
| JP | 2010-045333 | A | 2/2010 |
| JP | 2017-528940 | A | 9/2017 |
| KR | 10-2008-0106072 | A | 12/2008 |
| KR | 10-2017-0029497 | A | 3/2017 |
| WO | 2010/114602 | A1 | 10/2010 |
| WO | 2016/007250 | A1 | 1/2016 |
| WO | 2020/128244 | A1 | 6/2020 |

OTHER PUBLICATIONS

Chinese First Notification of Office Action for Application No. 202180069926.4 dated Mar. 5, 2026, 14 pages.

Singapore Written Opinion for Application No. 11202302340Q dated Oct. 24, 2025, 6 pages.

International Search Report for International Application No. PCT/FR2021/051662 dated Dec. 6, 2021, 2 pages.

International Search Report for International Application No. PCT/FR2021/051662 dated Dec. 6, 2021, 7 pages.

Japanese Final Rejection for Application No. 2023-518763 dated Sep. 5, 2025, 7 pages with English translation.

Korean Patent Rejection Decision for Application No. 10-2023-7015678 dated Sep. 24, 2025, 6 pages with machine translation.

Korean Office Action for Application No. 10-2023-7015678 dated Jan. 15, 2025, 18 pages with machine translation.

Chinese 2nd Office Action for Application No. 202180069926.4 dated Jul. 23, 2026, 20 pages with English translation.

* cited by examiner

COMPOSITE STRUCTURE FOR MEMS APPLICATIONS, COMPRISING A DEFORMABLE LAYER AND A PIEZOELECTRIC LAYER, AND ASSOCIATED MANUFACTURING PROCESS

CROSS-REFERENCE TO RELATED APPLICATIONS

This application is a national phase entry under 35 U.S.C. § 371 of International Patent Application PCT/FR2021/051662, filed Sep. 27, 2021, designating the United States of America and published as International Patent Publication WO 2022/079366 A1 on Apr. 21, 2022, which claims the benefit under Article 8 of the Patent Cooperation Treaty to French Patent Application Serial No. FR2010659, filed Oct. 16, 2020.

TECHNICAL FIELD

The present disclosure relates to the field of microelectronics and microsystems. It relates to, in particular, a composite structure comprising a piezoelectric layer and a single-crystal semiconductor layer with elastic properties, capable of deforming above at least one cavity. The present disclosure also relates to a process for fabricating the composite structure.

BACKGROUND

In the field of microelectromechanical systems (MEMS) and of actuators, it is conventional for substrates and components to comprise a thin piezoelectric layer placed on a deformable layer. The deformable layer has elastic properties that allow it to move or to deform, in the form of a movable membrane above a cavity. It will be noted that the term “membrane” is employed here in the broad sense, and encompasses a seal-tight or apertured membrane, a beam or any other form of membrane capable of bowing and/or deforming. The deformable layer provides the membrane with mechanical strength whereas the piezoelectric layer causes or detects a deformation of the membrane. This concept also extends to the field of acoustic-wave filters.

Thin-film piezoelectrics—especially PZT (lead zirconate titanate)—are often sensitive to aggressive exterior environments and therefore liable to degrade if they are exposed thereto for a long time. This may be, for example, the case with sensors or actuators such as microphones, loudspeakers or piezoelectric micro-machined ultrasonic transducers (pMUT). It is therefore necessary to provide, in the fabrication process, an additional step of depositing a protective film, on the piezoelectric layer, in order to isolate it from the exterior environment, but without affecting its performance.

Moreover, considering once again the example of a piezoelectric layer made of PZT, this material, which is simple to deposit, requires a recrystallization step at temperatures of about 700° C. if a good level of quality is to be achieved. For certain applications, the substrate comprising the deformable layer on which the piezoelectric layer must be deposited may prove to be incompatible with such temperatures: for example, if it comprises a glass or plastic carrier, or even if it comprises components such as transistors.

BRIEF SUMMARY

The present disclosure relates to an alternative solution to those of the prior art, and aims to remedy all or some of the aforementioned drawbacks. It relates, in particular, to a composite structure comprising a piezoelectric layer and a single-crystal semiconductor layer with elastic properties, able to deform above at least one cavity. The present disclosure also relates to a process for fabricating the composite structure.

The present disclosure relates to a composite structure comprising:

- a receiver substrate comprising at least one cavity defined in the substrate and devoid of solid material or filled with a sacrificial solid material,
- a single-crystal semiconductor layer placed on the receiver substrate, the layer having a free surface over the entire extent of the structure and a thickness between 0.1 micron and 100 microns,
- a piezoelectric layer that is securely fastened to the single-crystal semiconductor layer and placed between the latter and the receiver substrate.

In the composite structure according to the present disclosure, at least one segment of the single-crystal semiconductor layer is intended to form a movable membrane above the cavity, when the latter is devoid of solid material or after the sacrificial solid material has been removed, and the piezoelectric layer is intended to cause or to detect the deformation of the membrane.

According to other advantageous and non-limiting features of the present disclosure, which may be implemented alone or in any technically feasible combination:

- the piezoelectric layer comprises a material chosen from lithium niobate ($LiNbO_3$), lithium tantalate ($LiTaO_3$), potassium-sodium niobate ($K_xNa_{1-x}NbO_3$ or KNN), barium titanate ($BaTiO_3$), quartz, lead zirconate titanate (PZT), a compound of lead-magnesium niobate and of lead titanate (PMN-PT), zinc oxide (ZnO), aluminum nitride (AlN), and aluminum-scandium nitride (AlScN);
- the piezoelectric layer has a thickness smaller than 10 microns, and preferably smaller than 5 microns;
- the single-crystal semiconductor layer is made of silicon or silicon carbide;
- the piezoelectric layer is placed solely facing the at least one cavity of the receiver substrate;
- the piezoelectric layer is placed facing the—at least one cavity of the receiver substrate and is securely fastened to the receiver substrate beyond the at least one cavity.

The present disclosure also relates to a device based on a movable membrane above a cavity, the device being formed from the aforementioned composite structure, and comprising at least two electrodes making contact with the piezoelectric layer, wherein:

- the cavity is devoid of solid material,
- and at least one segment of the single-crystal semiconductor layer forms the movable membrane above the cavity.

The present disclosure lastly relates to a process for fabricating a composite structure comprising the following steps:

a) providing a donor substrate comprising a single-crystal semiconductor layer that is bounded between a front side of the donor substrate and a buried weak plane in the donor substrate, the layer having a thickness between 0.1 micron and 100 microns, b) providing a receiver substrate comprising at least one cavity defined in the substrate and opening onto a front side of the receiver substrate, the cavity being devoid of solid material or filled with a sacrificial solid material, c) forming a piezoelectric layer so that it is placed on the front side of the donor substrate and/or on the front side of the receiver substrate, d) joining the donor substrate and the receiver substrate via their respective front sides, e) cleaving, along the buried weak plane, the single-crystal semiconductor layer from the rest of the donor substrate, in order to form the composite structure comprising the single-crystal semiconductor layer, the piezoelectric layer and the receiver substrate.

According to other advantageous and non-limiting features of the present disclosure, which may be implemented alone or in any technically feasible combination:

the buried weak plane is formed by implanting light species into the donor substrate, and the cleave along the buried weaken plane is obtained via a heat treatment and/or via the application of a mechanical stress;

the buried weak plane is formed by an interface having a bonding energy lower than 0.7 $J/m^2$;

the fabrication process comprises a step of forming metal electrodes before and/or after step c), so that the electrodes make contact with the piezoelectric layer;

step c) comprises, when the piezoelectric layer is formed on the front side of the donor substrate, a local etch of the piezoelectric layer, so as to preserve the piezoelectric layer solely facing the—at least one cavity at the end of the joining step, step d).

BRIEF DESCRIPTION OF THE DRAWINGS

Other features and advantages of the present disclosure will become apparent from the following detailed description of the present disclosure, which is given with reference to the appended figures, in which.

In the figures, the same references may be used for elements of same type. The figures are schematic representations that, for the sake of readability, are not to scale. In particular, the thicknesses of the layers along the z-axis are not to scale with respect to the lateral dimensions along the x- and y-axes; and the relative thicknesses of the layers with respect to one another have not necessarily been respected in the figures.

DETAILED DESCRIPTION

Figure 1A:
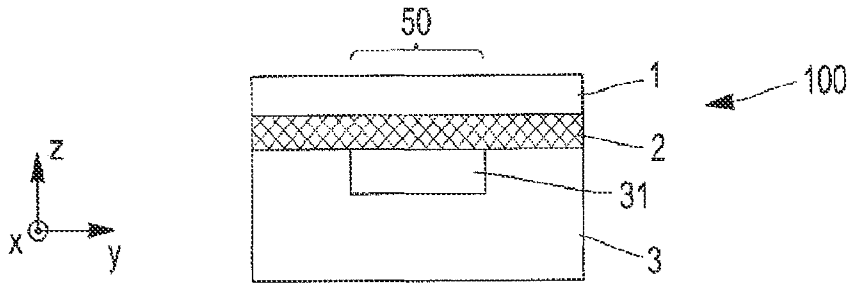
FIGS. 1A-1C show composite structures according to the present disclosure.
Figure 1B:
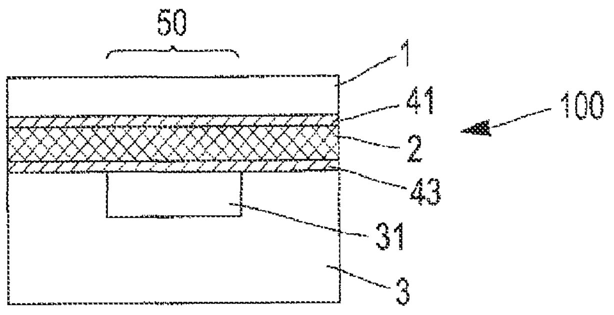

The composite structure 100 according to the present disclosure comprises a receiver substrate 3 that comprises at least one cavity 31 devoid of solid material or filled with a sacrificial solid material (FIGS. 1A and 1B). The receiver substrate 3 advantageously takes the form of a wafer, with a diameter larger than 100 mm, and, for example, of 150 mm, 200 mm, or 300 mm. Its thickness is typically between 200 and 900 microns. It is preferably composed of low-cost materials (silicon, glass, plastic) when its function is essentially mechanical, or formed from functionalized substrates (including components such as transistors, for example) when more complex integrated devices are intended to be formed on the composite structure 100.

The composite structure 100 also comprises a single-crystal semiconductor layer 1 placed on the piezoelectric layer 2. This layer 1 has mechanical properties allowing it to deform above a cavity, in a very controlled manner. The single-crystal character of the layer 1 guarantees the stability and reproducibility of its properties, in contrast, for example, to the case of a polycrystalline material, the mechanical properties of which are highly dependent on the deposition conditions (size and shape of the grains, nature of the grain boundaries, stresses, etc.). In the case of a single-crystal material, the mechanical properties of the layer 1 may thus be controlled, simulated and anticipated in a straightforward manner simply by knowing a few fundamental parameters such as the modulus of elasticity (Young's modulus) or even Poisson's ratio. This semiconductor layer 1 will be referred to as the single-crystal layer 1 or elastic layer 1, equivalently, in the rest of the description.

Preferably, nonlimitingly, the semiconductor layer 1 is formed from silicon or from silicon carbide. It advantageously has a thickness between 0.1 micron and 100 microns.

The composite structure 100 also comprises a piezoelectric layer 2 that is securely fastened to the single-crystal semiconductor layer 1 and placed between the latter and the receiver substrate 3.

According to a first variant illustrated in FIG. 1A, the piezoelectric layer 2 makes contact (direct contact or indirect contact, i.e., contact via another layer) with the single-crystal semiconductor layer 1 via one of its sides and makes (direct or indirect) contact with the receiver substrate 3 via its other side. If the receiver substrate 3 is of semiconducting or conducting nature, provision will possibly be made for an intermediate insulating layer 43 between the substrate 3 and the piezoelectric layer 2 (FIG. 1B). If the receiver substrate 3 is of insulating nature, this insulating layer 43 will not be required for electrical reasons but will possibly be useful for improving the adhesion between the layers and/or the structural quality of the piezoelectric layer 2.

Figure 1C:
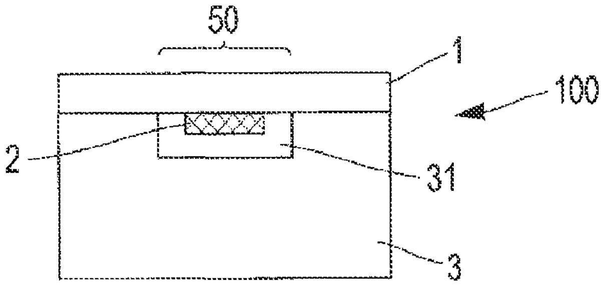

According to a second variant illustrated in FIG. 1C, the piezoelectric layer 2 makes contact (direct contact or indirect contact, i.e., contact via another layer) with the single-crystal semiconductor layer 1 locally via one of its sides, its other side being located facing the (at least one) cavity 31 of the receiver substrate 3.

In either of the described variants, provision will possibly be made for an intermediate insulating layer 41 between the elastic layer 1 and the piezoelectric layer 2 (FIG. 1B).

The intermediate insulating layers 41, 43 are typically composed of silicon oxide ($SiO_2$) or silicon nitride (SiN).

The piezoelectric layer 2 may comprise a material chosen from lithium niobate (LiNbO3), lithium tantalate (LiTaO3), potassium-sodium niobate ($K_xNa_{1-x}NbO_3$ or KNN), barium titanate (BaTiO3), quartz, lead zirconate titanate (PZT), a compound of lead-magnesium niobate and of lead titanate (PMN-PT) in variable proportions (for example, 70/30 or 90/10) depending on the sought-after properties, zinc oxide (ZnO), aluminum nitride (AlN), aluminum-scandium nitride (AlScN), etc. The thickness of the piezoelectric layer 2 may be between 0.5 micron and 10 microns, and preferably between 1 micron and 5 microns.

In the composite structure 100, the piezoelectric layer 2 is protected by the elastic layer 1. In certain cases, it will thus be possible to dispense with an additional protective layer for protecting the piezoelectric layer 2 from the exterior environment and/or for confining the piezoelectric layer 2 (piezoelectrics based on lead must be buried to be compatible with certain applications). Alternatively, provision will be made for a protective layer, but the latter will then be able to be simplified with respect to standard prior-art layers. According to yet another option, it may be desired to keep a standard protective layer, but its effectiveness will be increased because of the protection already provided by the present disclosure.

The composite structure 100 provides a membrane 50 that comprises at least one segment of the single-crystal layer 1, and that overhangs a cavity 31 produced in the receiver substrate 3. As mentioned in the introduction, the piezoelectric layer 2 is provided in order to cause or to detect the deformation of the membrane 50 above the cavity 31.

Figure 2:
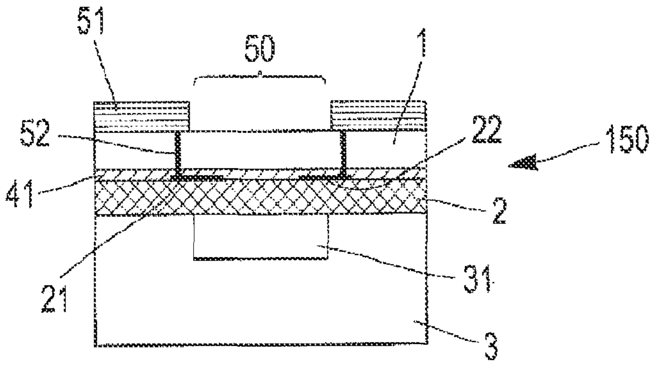
FIG. 2 shows a device based on a movable membrane above a cavity, the device being formed from a composite structure according to the present disclosure.

A device 150 based on a movable membrane 50 above a cavity 31 may thus be formed from the aforementioned composite structure 100 (FIG. 2). The device 150 comprises at least two electrodes 21, 22 making contact with the piezoelectric layer 2; they are intended to send and/or to collect an electrical signal associated with the deformation of the membrane 50. The electrodes 21, 22 may especially be formed from platinum, aluminum, titanium or even molybdenum. In the example of FIG. 2, the electrodes 21, 22 are placed against the side of the piezoelectric layer 2 that faces the elastic layer 1. Alternatively, they may be placed on the other side (facing the receiver substrate 3), or, respectively, on either side of the piezoelectric layer 2. When they are placed on the same side of the piezoelectric layer 2, the electrodes 21, 22 advantageously take the form of interdigitated combs. In all cases, to insulate the electrodes 21, 22 from the single-crystal layer 1 and/or from the receiver substrate 3, one (or more than one) insulating layer(s) 41, 43 is (are) provided in an intermediate position.

In the device 150, the (at least one) cavity 31 is devoid of solid material, so as to permit deformation of the membrane 50. In one sought-after application, the cavity 31 may thus be open or closed, the closure possibly going as far as an impermeable seal. In the latter case, a controlled atmosphere may be confined in the cavity 31. The controlled atmosphere will possibly correspond to a relatively high vacuum (for example, between $10^{-2}$ mbar and atmospheric pressure), and/or to a particular gas mixture (for example, a neutral atmosphere, nitrogen or argon, or ambient air).

In the case of an open cavity, the cavity may be opened in a number of ways. It may be opened from the back side, through the receiver substrate 3. In may also be opened via a lateral channel produced in the receiver substrate 3. It may also be opened via one or more through-orifices produced through the membrane 50. An embedded flexible beam is one example of a design generally associated with a composite structure of open-cavity type.

At least one segment of the elastic layer 1 forms the movable membrane 50 above the cavity 31. Moreover, functional elements 51 may be produced on or in the elastic layer 1, to interact with the electrodes of the piezoelectric layer 2 and/or with the membrane in general. Optionally, the functional elements 51 may comprise transistors, diodes or other microelectronic components.

As the piezoelectric layer 2 is buried under the elastic layer 1, it may be advisable to create conductive vias 52, extending through the layer 1 and through the intermediate insulating layer 41 if it is present, that allow the electrodes 21, 22 to be electrically connected from the front side of the composite structure 100. Alternatively, electrical connection may be achieved from the back side of the composite structure, by virtue of conductive vias passing all or some of the way through the receiver substrate 3 and the intermediate insulating layer 43 if it is present.

The present disclosure also relates to a process for fabricating the aforementioned composite structure 100. The process first comprises providing a donor substrate 10 having a front side 10*a* and a back side 10*b*. The donor substrate 10 advantageously takes the form of a wafer, with a diameter larger than 100 mm, and, for example, of 150 mm, 200 mm, or 300 mm. Its thickness is typically between 200 and 900 microns.

Figure 3A:
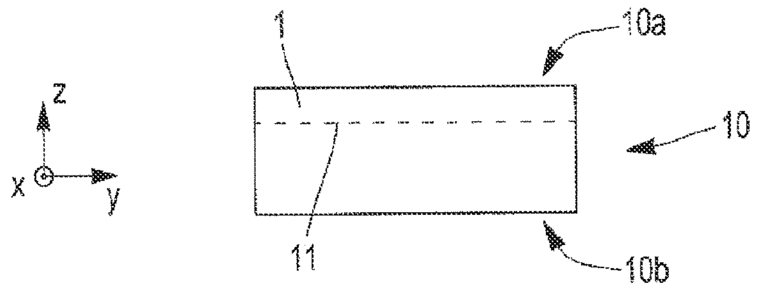
FIGS. 3A-3F show steps of a process for fabricating the composite structure, according to the present disclosure.

The donor substrate 10 comprises a single-crystal semiconductor layer 1, which is bounded between its front side 10*a* and a buried weak plane 11 formed in the donor substrate 10 (FIG. 3A).

Figure 4A:
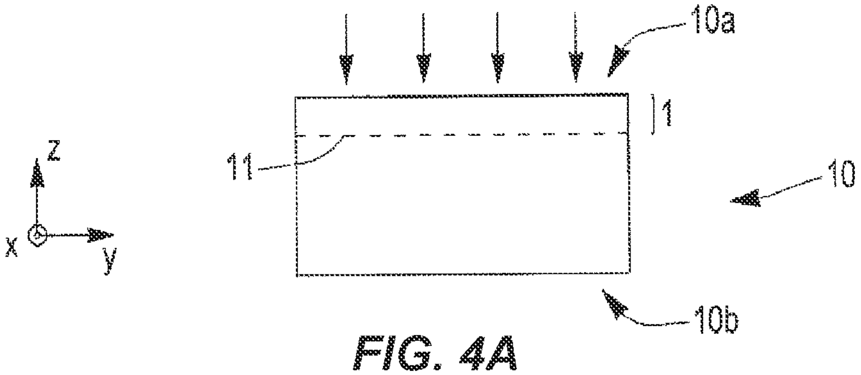
FIGS. 4A and 4B show donor substrates according to a first variant of implementation of the fabrication process according to the present disclosure.
Figure 4B:
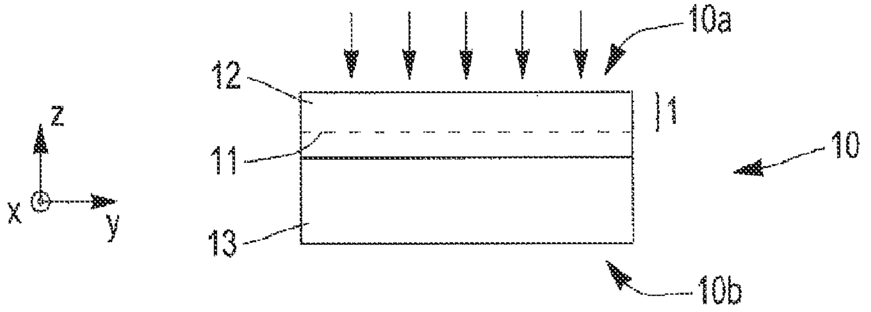

According to a first embodiment, the buried weak plane 11 is formed by implanting light species in the donor substrate 10, according to the principle of the Smart Cut™ process, which is particularly suitable for transferring thin single-crystal layers (FIG. 4A). The donor substrate 10 may be a blank single-crystal substrate, having the elastic properties targeted for the single-crystal layer 1. The donor substrate 10 may be a single-crystal silicon wafer. Alternatively, it may have on its front side 10*a*, a donor layer 12 in which the elastic layer 1 will be able to be delineated (FIG. 4B). The donor layer 12 may be placed on any carrier 13 able to provide the donor substrate 10 with strength, though, of course, the carrier will have to be compatible with the rest of the steps of the process. of the donor substrate 10 may comprise a donor layer 12 made of silicon produced by epitaxy on a carrier wafer 13 made of single-crystal silicon of lower quality.

This first embodiment is particularly suitable for single-crystal layers of thickness smaller than 2 microns.

Figure 5A:
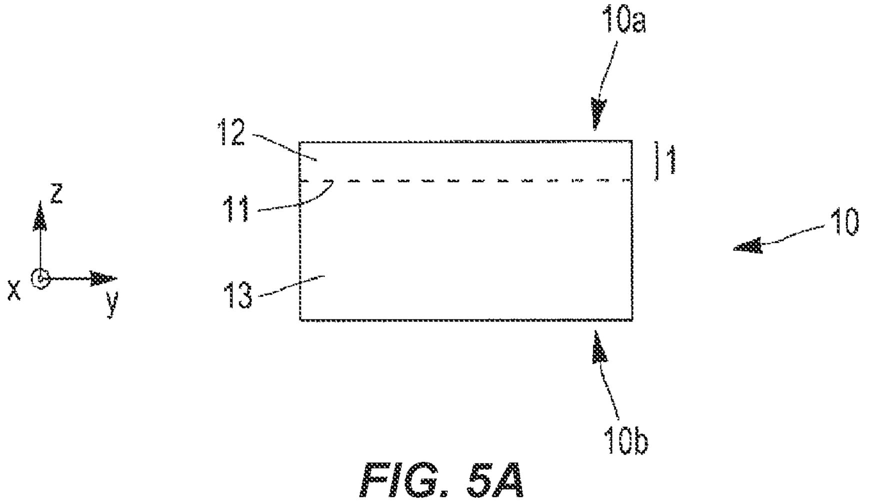
FIGS. 5A and 5B show donor substrates according to a second variant of implementation of the fabrication process according to the present disclosure.
Figure 5B:
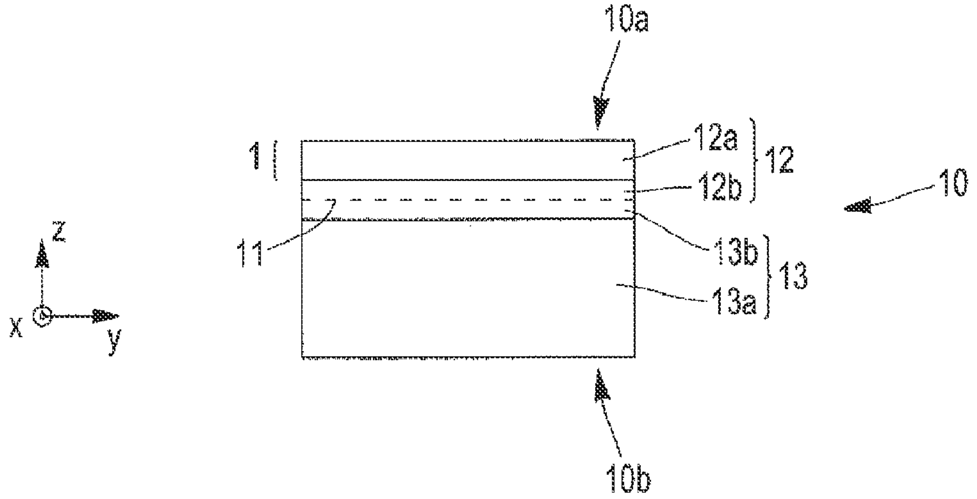

According to a second embodiment, the buried weak plane 11 is formed by an interface having a bonding energy typically lower than 0.7 J/m$^2$, so as to permit, subsequently in the process, cleaving at the interface. The donor substrate 10 is, in this case, a detachable substrate, two examples of which are illustrated in FIGS. 5A and 5B. It is formed from a surface layer 12 joined to a carrier 13 via a detachable bonding interface 11. Such an interface 11 may be obtained, for example, by roughening the surface of the surface layer 12 and/or the surface of the carrier 13, before direct bonding thereof by molecular adhesion. The fact that the joined surfaces have a roughness, typically between 0.5 nm and 1 nm RMS (measured by AFM, in scans of 20 microns×20 microns), decreases the bonding energy of the interface 11 and provides it with its detachable character.

In the first example in FIG. 5A, the surface layer 12 of the detachable donor substrate 10 is the single-crystal layer 1.

In the second example of FIG. 5B, the surface layer 12 comprises, on the one hand, a layer 12*a* that forms the crystalline layer 1, and on the other hand, a first bonding layer 12*b*, which is advantageously made of silicon oxide. The surface to be joined to this first bonding layer 12*b* is thus treated to roughen it, preventing the future crystalline layer 1 from having to undergo this treatment. Optionally, a second bonding layer 13*b* may be placed on the base 13*a* of the carrier 13. This second bonding layer is advantageously of same nature as the first bonding layer 12*b* and facilitates reuse of the base 13*a* after the surface layer 12 has been cleaved from it. In both described examples, the surface layer 12, which is intended to form all or some of the single-crystal layer 1, may be obtained from a single-crystal initial substrate, joined by the detachable interface 11 to the carrier 13, then thinned mechanically, chemically-mechanically and/or chemically, to thicknesses between a few microns and several tens of microns. For smaller thicknesses of surface layer 12, the Smart Cut™ process, for example, may be implemented to transfer the surface layer 12 from the initial substrate to the carrier 13, via the detachable interface 11.

According to a third embodiment, the buried weak plane 11 may be formed by a porous layer, for example, one made of porous silicon, or by any other weakened layer, film or interface able to be subsequently cleaved along the layer.

In either of these embodiments, the features of the single-crystal semiconductor layer 1 are chosen so as to confer, on the layer, the elastic properties targeted for the application. The thickness of the crystalline layer 1 may be between 0.1 micron and 100 microns. The material of the crystalline layer 1 is chosen, for example, from silicon, silicon carbide, etc.

Figure 3B:
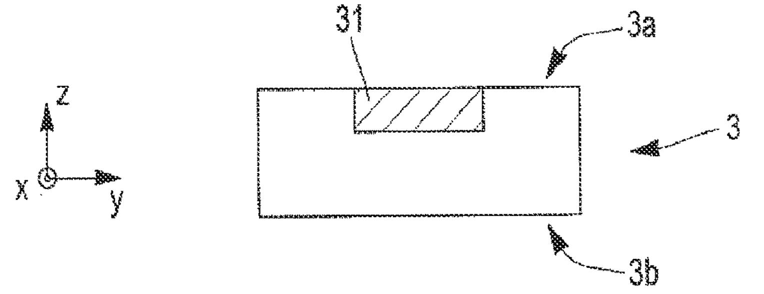

The fabrication process then comprises providing a receiver substrate 3 having a front side 3*a* and a back side 3*b* (FIG. 3B). The receiver substrate 3 advantageously takes the form of a wafer, with a diameter larger than 100 mm, and, for example, of 150 mm, 200 mm, or 300 mm. Its thickness is typically between 200 and 900 microns. The receiver substrate 3 is preferably formed from low-cost materials (silicon, glass, plastic) when its function is essentially mechanical, or formed from functionalized substrates (including components such as transistors, for example) when integrated devices are intended to be formed.

In all cases, the receiver substrate 3 comprises at least one cavity 31 that opens onto its front side 3*a*. One or a cavity 31 will be spoken of below, but the receiver substrate 3 advantageously comprises a plurality of cavities 31 distributed over the entirety of its front side 3*a*. A cavity 31 will possibly have dimensions, in the (x, y) plane of the front side 3*a*, between a few tens of microns and a few hundred microns, and a height (or depth), along the z-axis normal to the front side 3*a*, of about a few tenths of a micron to a few tens of microns.

The cavity 31 may be empty, i.e., devoid of solid material, or filled with a sacrificial solid material, which will be removed later, in the process for fabricating the composite structure 100 or during the fabrication of components on the composite structure 100.

It will be noted that it may be more advantageous to have, at this stage, a filled cavity 31 in order to facilitate the subsequent steps of the fabrication process. The sacrificial material placed in the cavity 31 may be silicon oxide, silicon nitride, amorphous or polycrystalline silicon, etc. It is chosen depending on the nature of the receiver substrate 3. Specifically, this material is intended to be removed, after the composite structure 100 has been formed: it must therefore be able to be chemically etched with good selectivity with respect to the receiver substrate 3 and to the elastic layer 1 and piezoelectric layer 2 (which are placed above the cavity).

The fabrication process then comprises a step c) of forming a piezoelectric layer 2. This layer 2 is formed on the single-crystal layer 1 of the donor substrate 10 and/or on the receiver substrate 3, directly or via an intermediate insulating layer 41, 43.

Figure 3C:
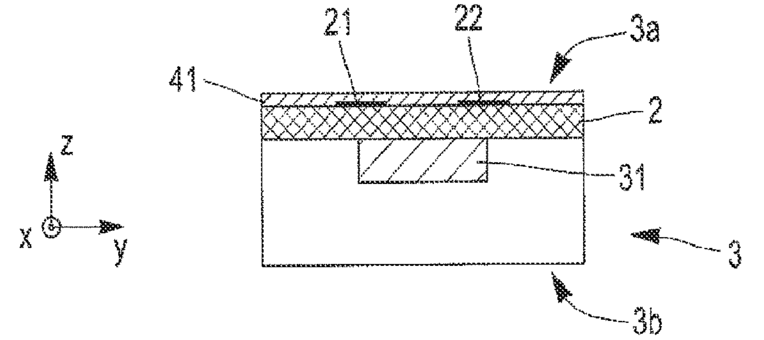

In the example of FIG. 3C, the piezoelectric layer 2 is placed on the receiver substrate 3. Alternatively, it may be placed on the donor substrate 10. In the latter case, the step c) may comprise a local etch of the piezoelectric layer 2, so as to produce patterns ("patterning") in the (x,y) plane of the layer 2. This makes it possible to define one or more slabs of piezoelectric layer 2 that are intended to be located facing one or more cavities of the receiver substrate 3 at the end of the following step, step d). Thus, the patterned piezoelectric layer 2 does not make contact with the receiver substrate 3, even though it is placed between the elastic layer 1 and the receiver substrate 3. At the end of the fabrication process, a composite structure 100 such as illustrated in FIG. 1C may thus be obtained.

The piezoelectric layer 2 may be formed by deposition, using deposition techniques such as physical vapor deposition (PVD), pulsed laser deposition (PLD), sol-gel processes or epitaxial processes; mention may especially be made of deposited material such as PZT, AlN, KNN, $BaTiO_3$, PMN-PT, ZnO, AlScN, etc. The piezoelectric layer 2 may alternatively be formed by transferring a layer from a source substrate to the destination substrate (donor substrate 10 and/or receiver substrate 3). The source substrate will possibly especially be made of $LiNbO_3$, $LiTaO_3$, etc. The piezoelectric layer 2 may be single-crystal or polycrystalline, depending on the technique used and the material chosen.

Depending on the nature of the piezoelectric layer 2, its formation may require relatively high temperatures. If the receiver substrate 3 is based on a functionalized substrate (one including components), the piezoelectric layer 2 is advantageously produced on the donor substrate 10. If the receiver substrate 3 is compatible with the temperatures of formation of the piezoelectric layer 2, the latter will possibly be produced on either or both of the donor substrate 10 and receiver substrate 3.

The donor substrate 10 is chosen, of course, among the aforementioned modes of implementation, so as to be compatible with the temperatures required to form the piezoelectric layer 2, when the latter is formed on the substrate 10. This choice will also be made taking into account any technical operations that it would be desirable to implement on the piezoelectric layer 2 and/or on the elastic layer 1 before the donor substrate 10 and receiver substrate 3 are joined.

By way of example, as known per se, PZT may be deposited at room temperature using a sol-gel process with a typical thickness of a few microns. To obtain a piezoelectric layer 2 made of good-quality PZT, it is then necessary to carry out a crystallization anneal at temperatures of about 700° C. If the piezoelectric layer 2 is formed on the donor substrate 10, a detachable substrate according to the second embodiment mentioned above, and which is compatible with temperatures higher than or equal to 700° C., will therefore preferably be chosen. Compatible here means that the detachable substrate preserves its detachable character even after application of the aforementioned temperatures.

According to another example, a polycrystalline AlN layer may be deposited between 250° C. and 500° C. using a conventional cathode-sputtering technique. A crystallization anneal is not required. Donor substrates 10 of the three embodiments mentioned above are compatible with such a deposition, as are most receiver substrates 3, even when functionalized.

The fabrication process according to the present disclosure advantageously comprises a step of forming metal electrodes 21, 22, making contact with the piezoelectric layer 2, before and/or after the deposition of the piezoelectric layer 2. The electrodes 21, 22 are formed either on a single side of the piezoelectric layer 2 and advantageously take the form of interdigitated combs, or on both sides of the layer 2, in a form such as two metal films. The material used to form the electrodes 21, 22 will possibly be, in particular, platinum, aluminum, titanium or even molybdenum.

The electrodes 21, 22 must not make direct contact with the crystalline layer 1; it is therefore necessary to provide an intermediate insulating layer 41 (FIG. 3C). It will be noted that the electrodes 21, 22 must also not make direct contact with the receiver substrate 3 when the latter is of semiconducting or conducting nature; in this case, an intermediate insulating layer 43 is provided between the piezoelectric layer 2 and the receiver substrate 3.

Figure 3D:
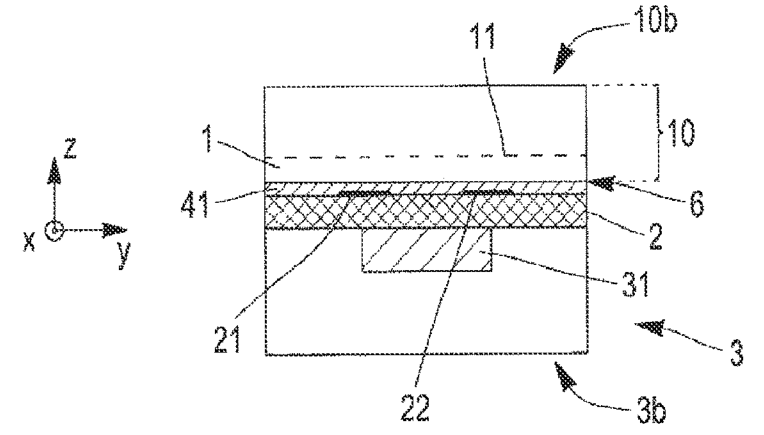

Following the formation of the piezoelectric layer 2, the fabrication process comprises a step of joining the donor substrate 10 and the receiver substrate 3 via their respective front sides 10*a*, 3*a* (FIG. 3D). Various joining techniques are contemplated. It will be possible, in particular, to implement direct bonding, by molecular adhesion, or bonding by thermocompression or even polymer bonding, with joined surfaces of insulating or metal nature. A bonding interface 6 is thus defined between the two substrates 10, 3, which form, at this stage of the process, a bonded structure.

According to a first option illustrated in FIGS. 3C and 3D, the piezoelectric layer 2 comprises two interdigitated electrodes 21, 22 and an insulating layer 41 on its free side, before it is joined. The insulating layer 41 electrically insulates the electrodes 21, 22 from the donor substrate 10 and promotes joint formation.

Figure 6:
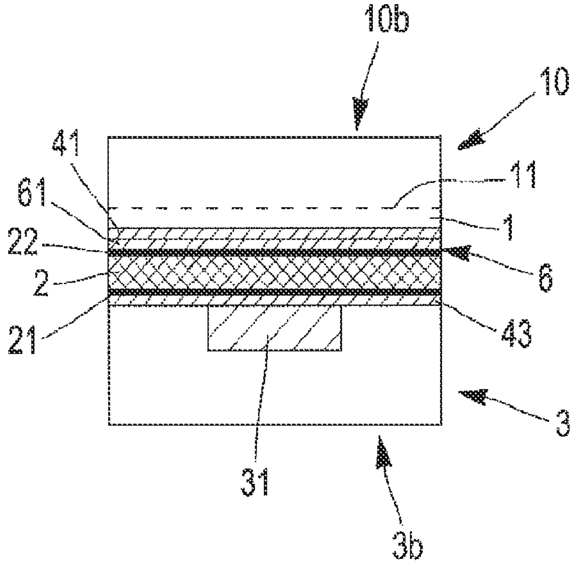
FIG. 6 shows a composite structure according to the present disclosure.

According to a second option, the piezoelectric layer 2 comprises a first electrode 21 and a second electrode 22 that are formed by metal films placed on either side of the layer 2 (as illustrated in FIG. 6). Metal bonding taking advantage of the presence of an electrode 22 on one side of the piezoelectric layer 2 will therefore advantageously be able to be implemented. The donor substrate 10 may then comprise a metal bonding layer 61 to be brought into contact with the electrode 22. An intermediate insulating layer 41 may be provided between the bonding layer 61 and the single-crystal layer 1.

The first and second options are illustrated with a piezoelectric layer 2 deposited on the receiver substrate 3; it will be noted that these options apply similarly if the layer is deposited on the donor substrate 10.

Figure 3E:
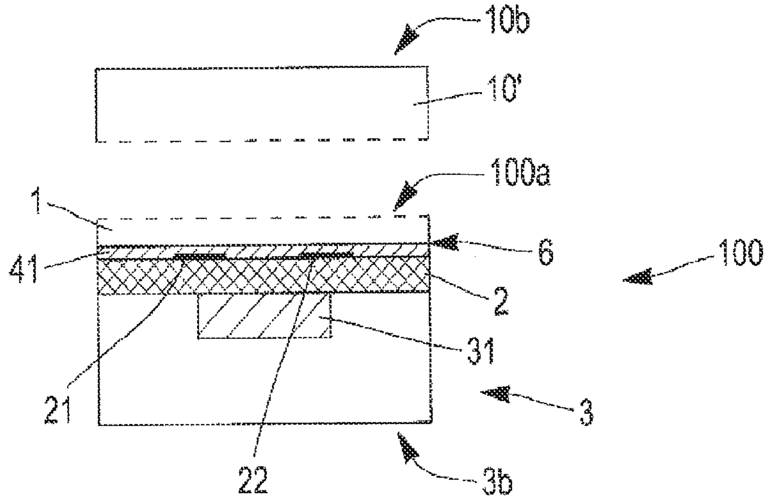

The fabrication process according to the present disclosure lastly comprises a step of cleaving, along the buried weak plane 11, the single-crystal layer 1 from the rest 10' of the donor substrate 10 (FIG. 3E). The composite structure 100, comprising the single-crystal semiconductor layer 1 placed on the piezoelectric layer 2, itself placed on the receiver substrate 3, is thus obtained.

The cleaving step may be carried out in various ways, depending on the chosen embodiment of the donor substrate 10.

In particular, according to the first embodiment, the cleave along the buried weak plane is achieved with a heat treatment and/or by applying a mechanical stress, which heat treatment and/or mechanical stress will cause splitting in the region of microcracks under a gas pressure that is generated by the implanted species.

According to the second embodiment, splitting along the buried weak plane 11 is preferably achieved by applying a mechanical stress to the detachable interface.

According to the third embodiment, application of a mechanical stress is also preferred.

The mechanical stress may be applied by inserting a beveled tool, for example, a Teflon blade, between the edges of the joined substrates: the tractive force is transmitted to the buried weak plane 11, in which a splitting or debonding wave is initiated. Of course, the tractive force is also applied to the bonding interface 6 of the bonded structure. It is therefore important to sufficiently strengthen this interface 6, so that the cleave occurs in the buried weak plane 11 and not at this interface 6.

Steps of finishing the front side 10*a* of the composite structure 100, which corresponds to the free surface of the single-crystal layer 1 after cleaving, will possibly be carried out, so as to restore a good level of quality in terms of roughness, defectiveness or nature of the material. This finishing may comprise smoothing by chemical-mechanical polishing, cleaning and/or chemical etches.

It is possible to produce a device 150 based on a movable membrane 50 above a cavity 31, from the obtained composite structure 100. To this end, apertures produced through the single-crystal layer 1, the piezoelectric layer 2, and potentially the electrodes 21, 22 and the intermediate insulating layers 41, 43, 61, allow the material with which the cavity 31 is filled (if the cavity 31 is actually filled at this stage of the process) to be etched selectively.

Figure 3F:
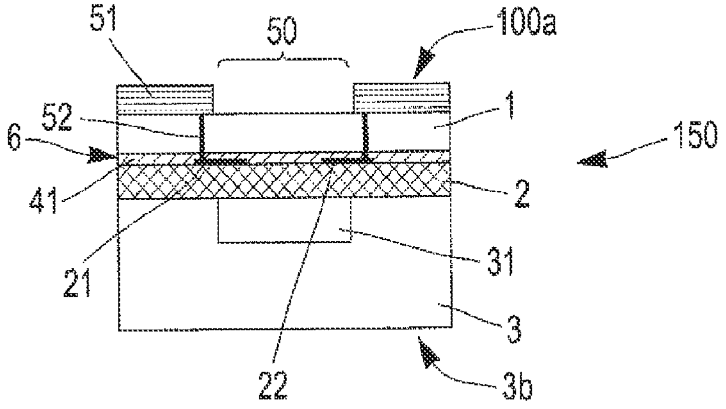

Functional elements 51, which are intended to be connected to the electrodes of the piezoelectric layer 2 or to interact with the membrane 50, may be produced on or in the elastic layer 1 (FIG. 3F). These functional elements 51 may comprise transistors, diodes or other microelectronic components. The composite structure 100 is advantageous in that it procures a single-crystal layer 1 with a blank planar free surface 100*a* that is robust and that moreover facilitates potential production of surface components.

Conductive vias 52, extending through the elastic layer 1, allow the electrodes 21, 22 to be electrically connected to the functional elements 51 if required.

EXAMPLES OF IMPLEMENTATION

According to a first example, the donor substrate 10 is a detachable substrate and the buried weak plane 11 corresponds to a bonding interface that has been roughened or that is of low temperature stability. The donor substrate 10 is of thick SOI type, with a surface layer 12*a* made of single-crystal silicon of 20 microns, on a buried silicon-oxide layer 12*b*, 13*b* at the heart of which lies the detachable interface 11 (FIG. 5B). The silicon-oxide layer 12*b*, 13*b* is itself placed on a carrier substrate 13*a* made of silicon.

A nucleation layer made of silicon oxide is formed on the front side 10*a* of the donor substrate 10 in order to promote satisfactorily textured growth and therefore ensure the layers that will be deposited subsequently (metal electrode 21, 22 and piezoelectric layer 2) are of good quality. A metal film intended to form a first electrode 21, made of platinum, is deposited on the nucleation layer. In order to improve the attachment of this metal film to the silicon oxide, an intermediate adhesion-promoting layer made of titanium is deposited beforehand, under the platinum. A conventional sol-gel deposition of a piezoelectric layer 2 made of PZT is then carried out, so as to form a layer of a few microns, for example, between 1 and 5 microns, in thickness. A crystallization anneal at a temperature between about 650° C. and 750° C. is then applied to the donor substrate 10 equipped with its piezoelectric layer 2. The second electrode 22, which is made of platinum, is deposited in the form of a metal film on the free surface of the PZT layer 2.

The receiver substrate 3 is a blank silicon substrate in which are etched cavities 31, for example, of square shape, having lateral dimensions of 50 microns and a depth of 5 microns. The cavities 31 are devoid of solid material. A silicon-oxide layer of 0.5 microns is deposited on the receiver substrate 3, including on the bottom and sidewalls of the cavities 31.

The donor substrate 10 and the receiver substrate 3 are joined by metal bonding via thermocompression between the film of the electrode on the front side 10_a_ of the donor substrate 10 and a metal layer deposited beforehand on the front side 3_a_ of the receiver substrate 3, beyond the cavities 31. The thermocompression conditions especially depend on the choice of the metals to be joined. A temperature between 300° C. and 500° C. will be employed, for example, in the case where gold was chosen for the metal layer deposited on the front side 3_a_ of the receiver substrate 3.

The insertion of a Teflon blade between the edges of the two joined substrates applies a mechanical stress to the detachable interface 11; since the latter is the weakest region of the bonded structure, cleaving occurs along the interface 11, leading to formation of the composite structure 100, on the one hand, and to obtainment of the rest 10' of the donor substrate 10, on the other hand.

Thus, a membrane 50 overhanging each cavity 31 is obtained. The membrane 50 comprises the elastic layer 1 of 20 microns made of single-crystal silicon and the piezoelectric layer 2 with its electrodes 21, 22, of a few microns thickness.

Additional steps aiming to electrically isolate a plurality of devices of the composite structure 100 and to form functional elements will then possibly be implemented.

In a second example, the initial donor and receiver substrates 10, 3 are similar to those of the first example. The receiver substrate 3 comprises a silicon-oxide layer on its front side 3_a_. This time, the cavities 31 are filled with silicon oxide, sacrificial material intended to be etched after fabrication of the composite structure 100.

A conventional sol-gel deposition of a piezoelectric layer 2 made of PZT is then carried out, so as to form a layer of a few microns, on the receiver substrate 3. A crystallization anneal at 700° C. is applied to the receiver substrate 3 equipped with its piezoelectric layer 2. Interdigitated electrodes 21, 22, which are made of platinum, are then produced on the free surface of the PZT layer 2.

An insulating layer 41 made of silicon oxide is deposited on the electrodes 21, 22 and the piezoelectric layer 2, then planarized (for example, by chemical-mechanical polishing), so as to promote attachment to the donor substrate 10.

The respective front sides of the donor substrate 10 and of the receiver substrate 3 are joined by direct oxide/silicon bonding via molecular adhesion. A heat treatment for consolidating the bonding interface 6 is carried out at a temperature between 600° C. and 700° C.

The insertion of a Teflon blade between the edges of the two joined substrates applies a mechanical stress to the detachable interface 11; since the latter is the weakest region of the bonded structure, cleaving occurs along the interface 11, leading to formation of the composite structure 100, on the one hand, and to obtainment of the rest 10' of the donor substrate 10, on the other hand.

The sacrificial material filling the cavities 31 may be etched at this stage or subsequently, after production of components or other functional elements 51 on the single-crystal layer 1. Thus, a membrane 50 overhanging each cavity 31 is obtained. The membrane 50 comprises the elastic layer 1 of 20 microns of single-crystal silicon and the piezoelectric layer 2 with its interdigitated electrodes of a few microns thickness.

According to a third example, the donor substrate 10 is a substrate made of single-crystal silicon and the buried weak plane 11 corresponds to a region implanted with hydrogen ions at an energy of 210 keV and a dose of about $7\times10^{16}/cm^2$. A single-crystal layer 1 of about 1.5 microns is thus bounded between the front side 10_a_ of the donor substrate 10 and the implanted region 11.

Conventional deposition by cathode sputtering of a piezoelectric layer 2 made of polycrystalline AlN is then carried out, so as to form a layer of between 0.5 and 1 micron thickness on the front side of the donor substrate 10, which will have been provided beforehand with an insulating layer. Electrodes 21, 22, which are made of molybdenum, are then produced on each side of the AlN layer 2.

The receiver substrate 3 is a blank silicon substrate in which are etched cavities 31, for example, of square shape, having lateral dimensions of 25 microns and a depth of 0.3 micron. The cavities 31 are filled with silicon oxide, sacrificial material intended to be etched after fabrication of the composite structure 100.

An insulating layer made of silicon oxide is deposited on the electrodes 21, 22 and the piezoelectric layer 2, then planarized (for example, by chemical-mechanical polishing), so as to promote attachment to the receiver substrate 3.

The respective front sides of the donor substrate 10 and of the receiver substrate 3 are joined by direct oxide/silicon bonding via molecular adhesion. A heat treatment for consolidating the bonding interface 6 is carried out at a temperature of 350° C.

The cleave along the buried weak plane 11 is obtained by applying a heat treatment to the bonded structure, at a temperature of about 500° C., and results from microcracks growing under pressure in the implanted region until a splitting wave has propagated right through the region. This cleave leads to formation of the composite structure 100, on the one hand, and to obtainment of the rest 10' of the donor substrate 10, on the other hand.

A step of finishing by chemical-mechanical polishing and standard cleaning is applied to the composite structure 100, in order to give the free surface of the layer 1 made of single-crystal silicon a good level of quality and a low roughness.

The sacrificial material filling the cavities 31 may be etched at this stage or subsequently, after production of components or other functional elements 51 on the single-crystal layer 1.

A membrane 50 overhanging each cavity 31 is obtained. The membrane 50 comprises the elastic layer 1 of 1.2 microns of single-crystal silicon and the AlN piezoelectric layer 2 with its electrodes, of less than one micron in thickness.

Of course, the present disclosure is not limited to the described embodiments and examples, and changes may be made thereto without departing from the scope of the invention as defined by the claims.

The invention claimed is:

1. A composite structure, comprising:

a receiver substrate comprising at least one cavity defined in the receiver substrate and devoid of solid material or filled with a sacrificial solid material;

a single-crystal semiconductor layer disposed on the receiver substrate, the single-crystal semiconductor layer having a free surface over an entire extent of the composite structure and a thickness between 0.1 micron and 100 microns;

a piezoelectric layer fastened to the single-crystal semiconductor layer and disposed between the single-crystal semiconductor layer and the receiver substrate;

wherein at least one segment of the single-crystal semiconductor layer is configured to form a movable membrane above the at least one cavity when the at least one cavity is devoid of solid material or after the sacrificial solid material has been removed; and wherein the piezoelectric layer is configured to cause or to detect deformation of the movable membrane.

2. The composite structure of claim 1, wherein the piezoelectric layer comprises a material chosen from lithium niobate ($LiNbO_3$), lithium tantalate ($LiTaO_3$), potassium-sodium niobate ($K_xNa_{1-x}NbO_3$ or KNN), barium titanate ($BaTiO_3$), quartz, lead zirconate titanate (PZT), a compound of lead-magnesium niobate and of lead titanate (PMN-PT), zinc oxide (ZnO), aluminum nitride (AlN), and aluminum-scandium nitride (AlScN).

3. The composite structure of claim 2, wherein the piezoelectric layer has a thickness less than 10 microns.

4. The composite structure of claim 3, wherein the single-crystal semiconductor layer is silicon or of silicon carbide.

5. The composite structure of claim 4, wherein the piezoelectric layer is placed solely facing the at least one cavity of the receiver substrate.

6. The composite structure of claim 5, wherein the piezoelectric layer faces the at least one cavity of the receiver substrate and is secured to the receiver substrate beyond the at least one cavity.

7. The composite structure of claim 3, wherein the piezoelectric layer has a thickness less than 5 microns.

8. The composite structure of claim 1, wherein the piezoelectric layer has a thickness less than 10 microns.

9. The composite structure of claim 1, wherein the single-crystal semiconductor layer is silicon or silicon carbide.

10. The composite structure of claim 1, wherein the piezoelectric layer is placed solely facing the-at least one cavity of the receiver substrate.

11. The composite structure of claim 5, wherein the piezoelectric layer faces the at least one cavity of the receiver substrate and is secured to the receiver substrate beyond the at least one cavity.

12. A device comprising a movable membrane above a cavity, the device comprising:

a composite structure, including:

a receiver substrate comprising at least one cavity defined in the receiver substrate and devoid of solid material;

a single-crystal semiconductor layer disposed on the receiver substrate, the single-crystal semiconductor layer having a free surface over an entire extent of the composite structure and a thickness between 0.1 micron and 100 microns;

a piezoelectric layer fastened to the single-crystal semiconductor layer and disposed between the single-crystal semiconductor layer and the receiver substrate;

wherein at least one segment of the single-crystal semiconductor layer is configured to form a movable membrane above the at least one cavity when the at least one cavity is devoid of solid material or after the sacrificial solid material has been removed; and wherein the piezoelectric layer is configured to cause or to detect deformation of the movable membrane;

at least two electrodes in contact with the piezoelectric layer; and wherein the at least one segment of the single-crystal semiconductor layer forms the movable membrane above the cavity.

13. A method of fabricating a composite structure, comprising the following steps:

a) providing a donor substrate comprising a single-crystal semiconductor layer bounded between a front side of the donor substrate and a buried weak plane in the donor substrate, the single-crystal semiconductor layer having a thickness between 0.1 micron and 100 microns;

b) providing a receiver substrate comprising at least one cavity defined in the receiver substrate and opening onto a front side of the receiver substrate, the at least one cavity being devoid of solid material or filled with a sacrificial solid material;

c) forming a piezoelectric layer disposed on the front side of the donor substrate and/or on the front side of the receiver substrate;

d) joining the donor substrate and the receiver substrate via respective front sides of the donor substrate and the receiver substrate; and e) cleaving, along the buried weak plane, the single-crystal semiconductor layer from a remainder of the donor substrate, to form the composite structure comprising the single-crystal semiconductor layer, the piezoelectric layer and the receiver substrate.

14. The method of claim 13, further comprising forming the buried weak plane by implanting light species into the donor substrate, and applying a heat treatment and/or a mechanical stress to the donor substrate to cause the cleaving.

15. The method of claim 13, wherein the buried weak plane comprises an interface having a bonding energy lower than 0.7 $J/m^2$.

16. The method of claim 13, comprising a step of forming metal electrodes before and/or after step c), so that the metal electrodes make contact with the piezoelectric layer.

17. The method of claim 13, wherein the piezoelectric layer is formed on the front side of the donor substrate, and wherein step c) comprises a local etch of the piezoelectric layer so as to preserve the piezoelectric layer solely facing the at least one cavity at the end of the joining step d).

* * * * *